US012671433B2

(12) United States Patent　　　　　　(10) Patent No.:　US 12,671,433 B2
Kobayashi　　　　　　　　　　　　　　(45) Date of Patent:　Jun. 30, 2026

(54) ANALOG-TO-DIGITAL CONVERSION CIRCUIT AND CURRENT MEASUREMENT CIRCUIT

(71) Applicant: Nuvoton Technology Corporation Japan, Kyoto (JP)

(72) Inventor: Hitoshi Kobayashi, Osaka (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 141 days.

(21) Appl. No.: 18/392,528

(22) Filed: Dec. 21, 2023

(65) Prior Publication Data

US 2024/0128981 A1　　Apr. 18, 2024

Related U.S. Application Data

(63) Continuation of application No. PCT/JP2022/024805, filed on Jun. 22, 2022.

(30) Foreign Application Priority Data

Jun. 30, 2021　(JP) ................................. 2021-108269

(51) Int. Cl.
　　*H03M 1/88*　　　(2006.01)
　　*H03M 1/18*　　　(2006.01)
　　*G01R 19/00*　　 (2006.01)
(52) U.S. Cl.
　　CPC ......... *H03M 1/188* (2013.01); *G01R 19/0092* (2013.01)
(58) Field of Classification Search
　　CPC ....................................................... H03M 1/88
　　USPC .................. 341/118, 120, 155; 375/324, 345
　　See application file for complete search history.

(56) References Cited

U.S. PATENT DOCUMENTS

| | | | |
|---|---|---|---|
| 6,172,635 B1 | 1/2001 | Nakamura et al. | |
| 9,374,003 B1 * | 6/2016 | McJimsey ............. | H02M 3/158 |
| 9,397,690 B2 | 7/2016 | Lasseuguette et al. | |
| 2002/0075004 A1 | 6/2002 | Yudahira et al. | |
| 2007/0120721 A1 | 5/2007 | Caduff et al. | |
| 2013/0142293 A1 * | 6/2013 | Yoshida ............... | H03G 3/3078 |
| | | | 375/345 |

FOREIGN PATENT DOCUMENTS

| | | |
|---|---|---|
| JP | 2002-139522 A | 5/2002 |
| JP | 2014-163734 A | 9/2014 |

OTHER PUBLICATIONS

International Search Report dated Aug. 9, 2022 issued in International Patent Application No. PCT/JP2022/024805, with English translation.

* cited by examiner

*Primary Examiner* — Peguy Jean Pierre
(74) *Attorney, Agent, or Firm* — Rimon P.C.

(57)　　　　　　　ABSTRACT

An analog-to-digital conversion circuit includes: a first variable gain amplifier connected to an input terminal; a first AD converter connected to the first variable gain amplifier; a second variable gain amplifier connected to the input terminal; a second AD converter connected to the second variable gain amplifier; a selection circuit to which an output of the first AD converter and an output of the second AD converter are input, and which selects one of the outputs; and a control circuit that controls a gain change period of the first variable gain amplifier and a gain change period of the second variable gain amplifier in a relative manner.

19 Claims, 8 Drawing Sheets

(a) Input signal (b) Gain 1

(c) Timer 1

(d) Output signal 1

(e) Gain 2

(f) Timer 2

(g) Output signal 2

(i) Operation state (j) Valid data

ANALOG-TO-DIGITAL CONVERSION CIRCUIT AND CURRENT MEASUREMENT CIRCUIT

CROSS REFERENCE TO RELATED APPLICATIONS

This is a continuation application of PCT International Application No. PCT/JP2022/024805 filed on Jun. 22, 2022, designating the United States of America, which is based on and claims priority of Japanese Patent Application No. 2021-108269 filed on Jun. 30, 2021. The entire disclosures of the above-identified applications, including the specifications, drawings and claims are incorporated herein by reference in their entirety.

FIELD

The present disclosure relates to an analog-to-digital conversion circuit and a current measurement circuit.

BACKGROUND

Patent Literature (PTL) 1 discloses an A/D converter that includes an analog digital converter (ADC) which performs AD conversion on an analog signal and another ADC which performs AD conversion on a low-level analog signal, to enhance conversion accuracy.

PTL 2 discloses a technique of controlling gain using an analog-to-digital conversion circuit that performs AD conversion on the voltage at both ends of a shunt resistor for detecting the battery current of a vehicle.

In addition, in electric vehicles, when overcurrent which exceeds an allowable range of current flows through a lithium ion cell stack, there is a possibility that the cell life of the lithium ion cell stack will be severely deteriorated, leading to destruction. For that reason, for electric vehicles, very high safety requirements are required for the current measurement of lithium ion cell stacks, and it is necessary to meet the requirements of the automotive safety integrity level D (ASIL-D) which is the highest functional safety level based on ISO 26262. Therefore, redundancy is required for an AD converter for current measurement in an integrated circuit that performs current measurement, and two or more AD converters are used to measure the same current value so as to ensure measurement accuracy and redundancy.

Furthermore, in an electric vehicle powered by a lithium ion cell stack, the output current value of the lithium ion cell stack varies rapidly and irregularly from approximately a few mA to several 100A from a complete standstill state to a maximum output. The dynamic range of the current measurement needs to be greater than or equal to 120 dB because the width of the change is a hundred-thousand-fold or more.

Therefore, in such a high dynamic range measuring circuit, in general, a variable gain amplifier (hereinafter referred to as VGA) is provided at a pre-stage of an AD converter to expand the dynamic range of the AD converter, thereby achieving both the dynamic range and resolution of the AD converter which are in a trade-off relationship.

In addition, a system in which the amplification factor of the VGA can be automatically changed according to an input amplitude is called automatic gain control (hereinafter referred to as AGC).

CITATION LIST

Patent Literature

PTL 1: U.S. Pat. No. 6,172,635
PTL 2: U.S. Pat. No. 9,397,690

SUMMARY

Technical Problem

Unfortunately, in general, VGAs have characteristics similar to a low-pass filter with a band-limited frequency characteristics as indicated in FIG. 7, and thus an output signal immediately after the start of gain change slowly varies with frequency response due to a phase lag. As a result, it is not possible to measure a correct value by the AD converter in the gain change period until the output signal stabilizes. In addition, a phase lag also occurs in the AD converter itself, such as a delta-sigma type and an integral type. Therefore, the waiting time from the start of gain change to the point of obtaining a correct measurement value takes at least the sampling time of the AD converter.

The present disclosure provides an analog-to-digital conversion circuit and a current measurement circuit that reduce the waiting time from the start of gain change to the point of obtaining a correct measurement value.

Solution to Problem

In order to achieve the above, an analog-to-digital conversion circuit according to an aspect of the present disclosure includes: a first variable gain amplifier connected to an input terminal; a first AD converter connected to the first variable gain amplifier; a second variable gain amplifier connected to the input terminal; a second AD converter connected to the second variable gain amplifier; a selection circuit to which an output of the first AD converter and an output of the second AD converter are input; and a control circuit that controls a gain change period of the first variable gain amplifier and a gain change period of the second variable gain amplifier in a relative manner.

In addition, a current measurement circuit according to an aspect of the present disclosure includes the above-described analog-to-digital conversion circuit.

Advantageous Effects

With the analog-to-digital conversion circuit and the current measurement circuit according to the present disclosure, it is possible to reduce the waiting time from the start of gain change to the point of obtaining a correct measurement value.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, the embodiments of an analog-to-digital conversion circuit according to an aspect of the present disclosure will be described in detail with reference to the drawings.

It should be noted that the embodiments described below each show a general or specific example of the present disclosure. The numerical values, shapes, materials, structural components, the arrangement and connection of the structural components, steps, the processing order of the steps etc. described in the following embodiments are mere examples, and therefore do not limit the scope of the present disclosure. In addition, among the structural components in the following embodiments, structural components not recited in any one of the independent claims are described as arbitrary structural elements.

Embodiment 1

Figure 1:
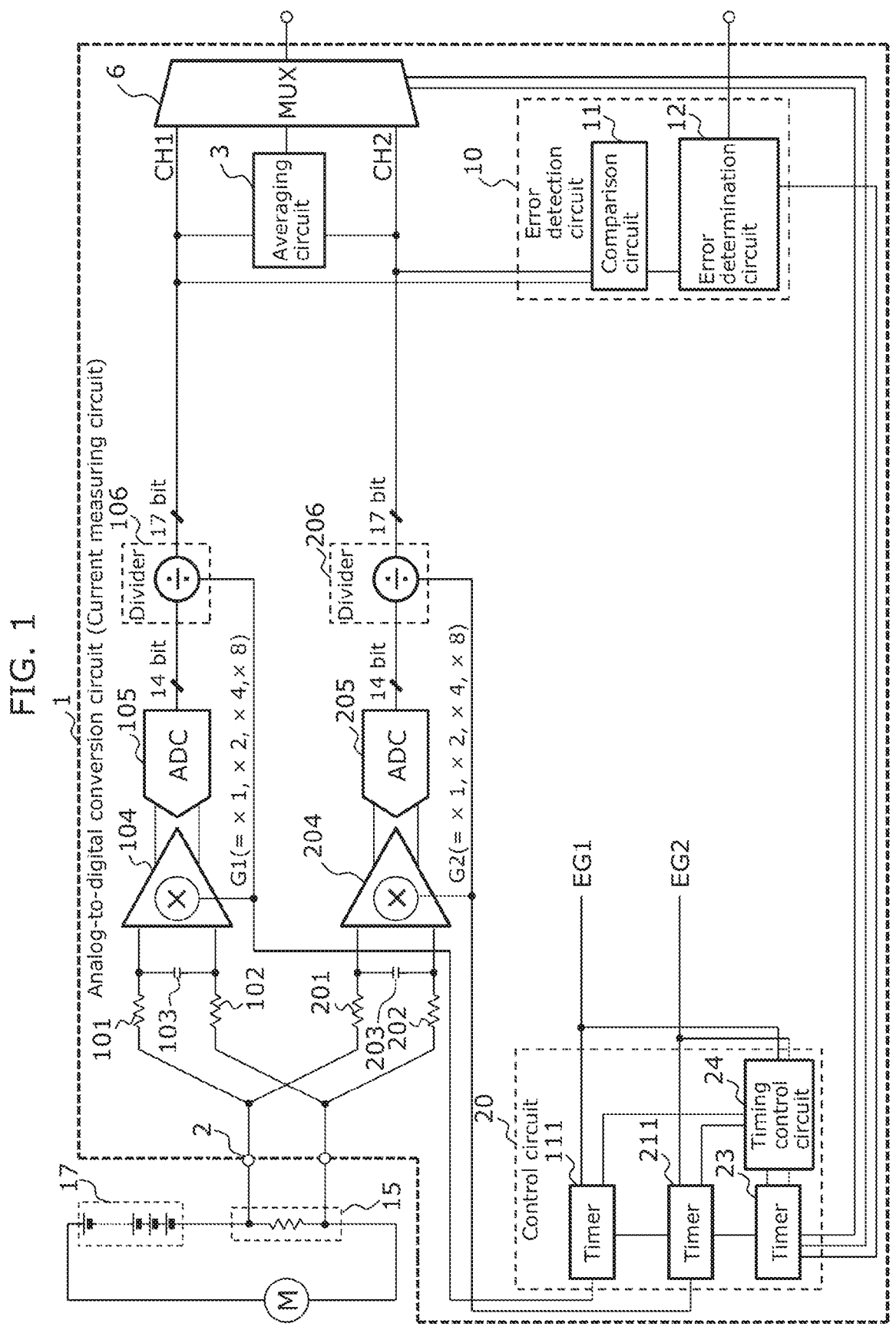
FIG. 1 is a diagram illustrating an example of the configuration of an analog-to-digital conversion circuit according to Embodiment 1.

FIG. 1 is a diagram illustrating an example of the configuration of analog-to-digital conversion circuit 1 according to Embodiment 1. In this diagram, an electric circuit that outputs an analog signal to be converted is also illustrated in addition to analog-to-digital conversion circuit 1.

This electric circuit is, for example, a circuit installed in an electric vehicle or a hybrid vehicle, and includes motor M, cell stack 17, and shunt resistor 15.

Motor M generates rotational driving force for vehicle driving with power supplied from cell stack 17, and also generates regenerative power during deceleration to charge cell stack 17.

Cell stack 17 includes one or more battery cells. The battery cell is, for example, a lithium ion battery. It should be noted that the battery cell may be a power storage capacitor cell.

Shunt resistor 15 is a resistor element for current detection having a small resistance value. The voltage drop of shunt resistor 15 is proportional to the current flowing through cell stack 17. It should be noted that a magnetic circuit as a current sensor may be included instead of shunt resistor 15. The magnetic circuit may, for example, include a magnetic core, and be a magnetic proportion system (i.e., an open-loop system). In addition, the magnetic circuit may be a magnetic balance system (i.e., servo system) or a flux-gate system (i.e., magnetic balance system), including a magnetic core and a coil.

Analog-to-digital conversion circuit 1 illustrated in FIG. 1 includes: input terminal 2, first variable gain amplifier 104, first AD converter 105, first divider 106, second variable gain amplifier 204, second AD converter 205, second divider 206, control circuit 20, averaging circuit 3, selection circuit 6, and error detection circuit 10.

Input terminal 2 is a pair of terminals connected to both ends of shunt resistor 15. The voltage appearing at the pair of terminals is the voltage drop of shunt resistor 15 as well as an analog signal indicating the magnitude of the current that flows through cell stack 17. One of the terminals in the pair is connected to one of two input terminals of first variable gain amplifier 104 via input resistor 101. The other of the terminals in the pair is connected to the other of the two input terminals of first variable gain amplifier 104 via input resistor 102. It should be noted that capacitative element 103 for noise reduction is added between the two input terminals of first variable gain amplifier 104.

First variable gain amplifier 104 is a variable-gain amplifier including two input terminals, two output terminals, and a gain control terminal. Gain control signal G1 which instructs gain is input to the gain control terminal. First variable gain amplifier 104 amplifies an analog signal that has been input at the gain instructed by gain control signal G1, and outputs the analog signal that has been amplified to first AD converter 105.

Gain control signal G1 is assumed to be provided by a high-order system external to analog-to-digital conversion circuit 1. FIG. 1 illustrates an example in which gain control signal G1 instructs onefold, twofold, fourfold, or eightfold gain to first variable gain amplifier 104. It should be noted that the gain indicated by gain control signal G1 may be a power of 2 other than those stated above, or may be other than a power of 2.

First AD converter 105 converts an analog signal output from first variable gain amplifier 104 to a digital signal. First AD converter 105 may be a delta-sigma type or an integral type. The combination of first AD converter 105 and first variable gain amplifier 104 is capable of extending the dynamic range of first AD converter 105 and improving the resolution in a trade-off relationship.

First divider 106 divides the digital signal from first AD converter 105 by the gain indicated by gain control signal G1 to obtain a quotient. The weight of each bit of the digital signal that is the quotient is maintained without any change before and after the gain indicated by gain control signal G1 is changed. When the gain indicated by gain control signal G1 is expressed as a power of 2, first divider 106 divides the digital signal by bit shift.

The circuit section including second variable gain amplifier 204, second AD converter 205, and second divider 206 (hereinafter also referred to as a second system) may have the same configuration as the circuit section including first variable gain amplifier 104, first AD converter 105, and first divider 106 (hereinafter also referred to as a first system). In other words, the above-described two circuit sections may be redundantly duplicated in the configuration.

Control circuit 20 receives from outside gain signal EG1 and gain signal EG2 which instruct gain, and controls the gain of each of first variable gain amplifier 104 and second variable gain amplifier 204, and the divisor of each of first divider 106 and second divider 206. At this time, control circuit 20 controls a gain change period of first variable gain amplifier 104 and a gain change period of second variable gain amplifier 204 in a relative manner. Here, the gain change period is a time period from the start of gain change until the output stabilizes. For example, control circuit 20 controls the gain change such that the gain change period of first variable gain amplifier 104 does not overlap with the gain change period of second variable gain amplifier 204. In addition, control circuit 20 may control a normal operation mode in which first variable gain amplifier 104 and second variable gain amplifier 204 operate at the same gain, and a gain change mode in which the gain in the normal operation mode is changed to another gain to cause the operation mode to return to the normal operation mode. In this case, in the normal operation mode, control circuit 20 changes gain signal EG1 and gain signal EG2 substantially at the same time. For example, when one of gain signal EG1 or gain signal EG2 is changed, control circuit 20 first changes the gain of first variable gain amplifier 104, waits for the gain change period to elapse, and then changes the gain of second variable gain amplifier 204.

Control circuit 20 illustrated in FIG. 1 includes timer 111, timer 211, timer 23, and timing control circuit 24, and controls the gain change such that the gain change period of first variable gain amplifier 104 does not overlap with the gain change period of second variable gain amplifier 204.

Timer 111 counts the gain change period of first variable gain amplifier 104. In other words, under the control of timing control circuit 24, timer 111 measures a certain time from the start of the gain change of first variable gain amplifier 104 until the output stabilizes.

Timer 211 counts the gain change period of second variable gain amplifier 204. In other words, under the control of timing control circuit 24, timer 211 measures a certain time from the start of the gain change of second variable gain amplifier 204 until the output stabilizes.

Timer 23 is an auxiliary timer for adjustment that adds adjustment time to the measured time of timer 111 and timer 211. Timer 23 may be omitted.

Timing control circuit 24 controls timer 111, timer 211, and timer 23 based on gain signal EG1 and gain signal EG2 to control the timing for changing gain control signal G1 and gain control signal G2. For example, when one of gain signal EG1 or gain signal EG2 is changed, for example, timing control circuit 24 first changes gain control signal G1, waits for the gain change period to elapse, and then changes gain control signal G2. Alternatively, when gain signal EG1 is changed, timing control circuit 24 does not change gain control signal G1 if timer 211 is in the middle of counting, and changes gain control signal G1 after timer 211 completes the counting. In addition, when gain signal EG2 is changed, timing control circuit 24 does not change gain control signal G2 if timer 111 is in the middle of counting, and changes gain control signal G2 after timer 111 completes the counting.

Averaging circuit 3 calculates the average value of two measurement results made redundantly by the first system and the second system at the same gain.

Selection circuit 6 selects any one of: the measurement result of the first system; that is, the output value of first divider 106; the measurement result of the second system; that is, the output value of second divider 206; or the average value of averaging circuit 3.

Error detection circuit 10 detects a measurement error based on the difference or ratio of two measurement results redundantly made by the first system and the second system at the same gain. Therefore, error detection circuit 10 includes comparison circuit 11 and error determination circuit 12.

Comparison circuit 11 compares the output value of first divider 106 with the output value of second divider 206, and outputs an error.

Error determination circuit 12 determines that an error has occurred and outputs an error signal when the error that has been output from comparison circuit 11 exceeds an allowable value.

The following described the operation of analog-to-digital conversion circuit 1 configured as described above.

Figure 2A:
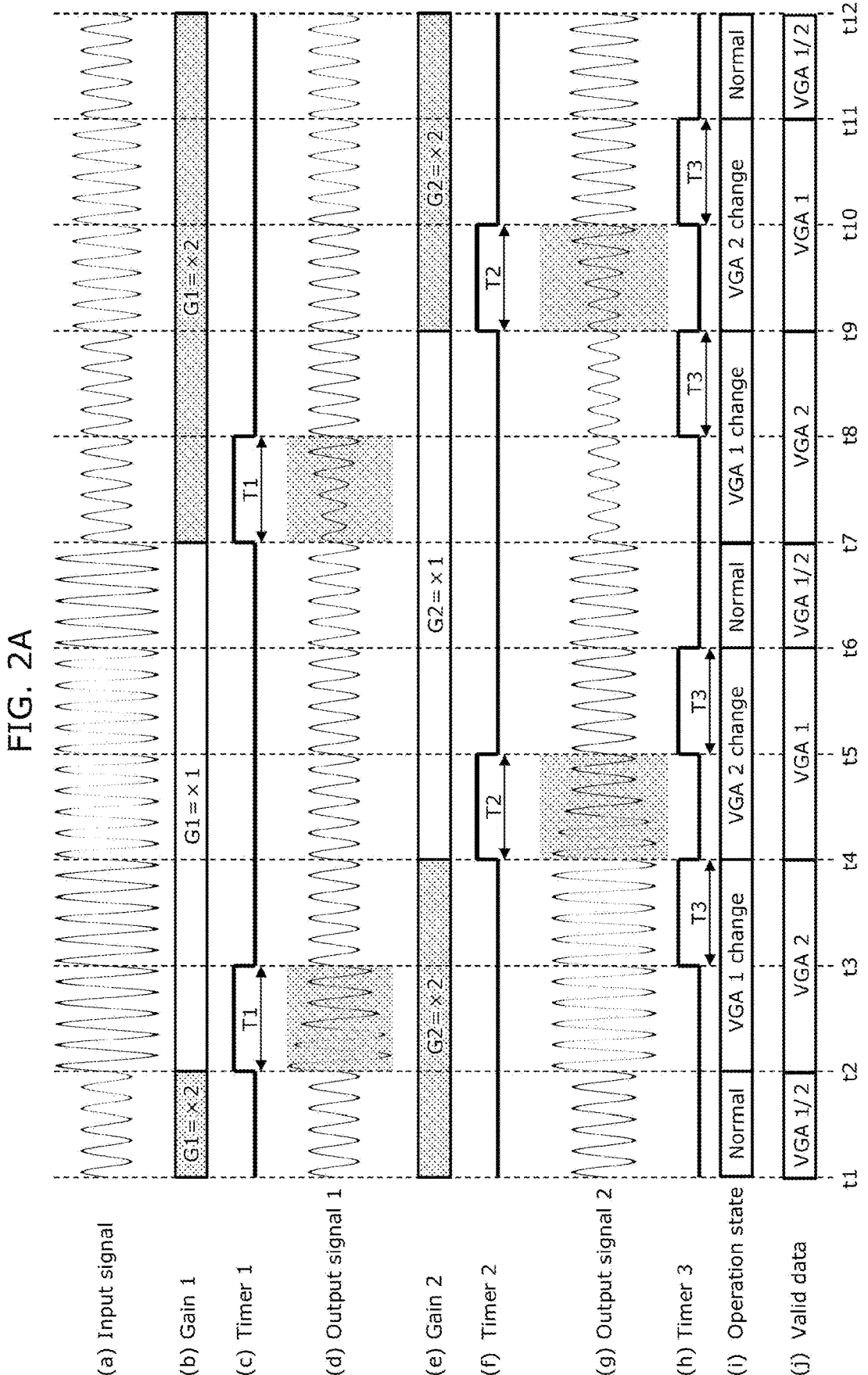
FIG. 2A is a time chart illustrating an example of the operation of the analog-to-digital conversion circuit according to Embodiment 1.

FIG. 2A is a time chart illustrating an example of the operation of analog-to-digital conversion circuit 1 according to Embodiment 1.

In the diagram, the field denoted by (a) Input signal indicates the analog signal input to input terminal 2 in the form of the voltage waveform corresponding to the magnitude of the AC current caused by the switching operation to drive motor M.

The field denoted by (b) Gain 1 indicates the gain of gain control signal G1. The field denoted by (c) Timer 1 indicates the operation state of timer 111. More specifically, a high level indicates that timer 111 is counting, and a low level indicates that timer 111 is not counting. The field denoted by (d) Output signal 1 indicates the output of first variable gain amplifier 104.

The field denoted by (e) Gain 2 indicates the gain of gain control signal G2. The field denoted by (f) Timer 2 indicates the operation state of timer 211. More specifically, a high level indicates that timer 211 is counting, and a low level indicates that timer 211 is not counting. The field denoted by (g) Output signal 2 indicates the output of second variable gain amplifier 204. The field denoted by (h) Timer 3 indicates the operation state of timer 23. More specifically, a high level indicates that timer 23 is counting, and a low level indicates that timer 23 is not counting.

The field denoted by (i) Operation state indicates the operation state of analog-to-digital conversion circuit 1. In (i) Operation state, "Normal" indicates the normal operation in which first variable gain amplifier 104 and second variable gain amplifier 204 operate at the same gain; "VGA 1 change" indicates the operation of changing the gain of first variable gain amplifier 104; and "VGA 2 change" indicates the operation of changing the gain of second variable gain amplifier 204. The field denoted by (j) Valid data indicates stable output values unaffected by a gain change. In (j) Valid data, "VGA 1" indicates that the output value of the first system, i.e., first divider 106, is valid; "VGA 2" indicates that the output value of the second system, i.e., second divider 206, is valid; and "VGA 1/2" indicates that the output value of first divider 106 and the output value of second divider 206 are both valid.

In FIG. 2A, time points t1 through t12 do not indicate equal time intervals, but merely schematically illustrate the change points in the operation.

From time points t1 to t2, first variable gain amplifier 104 and second variable gain amplifier 204 operate at the same gain; that is, at the gain of gain control signal G1=G2=twofold. In other words, analog-to-digital conversion circuit 1 operates in the normal operation mode.

At time point t2, the amplitude of the input signal increases, and gain signals EG1 and EG2 are both assumed to be changed accordingly from indicating the twofold gain to indicating the onefold gain. In response, control circuit 20 changes gain control signal G1 from indicating the twofold gain to indicating the onefold gain, maintains the twofold gain indicated by gain control signal G2 without any change, and causes timer 111 to start counting time T1. In response to the change in gain control signal G1, first variable gain amplifier 104 changes the gain from twofold to onefold. This gain change period corresponds to the shaded portion in (d) Output signal 1. Time T1 counted by timer 111 is greater than or equal to the gain change period of first variable gain amplifier 104. In the diagram, time T1 is assumed to be set equal to the gain change period.

The period from time points t2 to t3 corresponds to the gain change period of first variable gain amplifier 104.

At time point t3, first variable gain amplifier 104 is in a state in which a stable digital value can be output at the onefold gain after the change. At this point, when time T1 is set to the same time as the gain change period, the gain change operation of first variable gain amplifier 104 is supposed to be complete and the output is supposed to be stable. However, in some cases, the actual gain change period is longer than time T1 due to the effect of temperature characteristics or the like. Accordingly, timer 23 starts counting time T3 at the end of the count of time T1 by timer 111 (i.e., time point t3). Time T3 is an adjustment time added to prevent time T1 from being smaller than the actual gain change period when the gain change period becomes longer due to the temperature characteristics or the like of first variable gain amplifier 104.

At time point t4, a time period (T1+T3) exceeding the gain change period has elapsed since the start of the gain change of first variable gain amplifier 104, and thus the output of first variable gain amplifier 104 is completely free from the effect of the gain change and is stable. In addition, in response to the completion of the gain change of first variable gain amplifier 104, control circuit 20 subsequently changes gain control signal G2 from indicating a twofold gain to indicating a onefold gain, and causes timer 211 to start counting time T2. In response to the change in gain control signal G2, second variable gain amplifier 204 changes the gain from twofold to onefold. This gain change period corresponds to the shaded portion in (g) Output signal 2. Time T2 counted by timer 211 is greater than or equal to the gain change period of second variable gain amplifier 204. In the diagram, time T2 is assumed to be set equal to time T1 and the gain change period.

At time point t5, second variable gain amplifier 204 is in a state in which a stable digital value can be output at the onefold gain after the change. At this point, when time T2 is set to the same time as the gain change period, the gain change operation of second variable gain amplifier 204 is supposed to be complete and the output is supposed to be stable. However, in some cases, the actual gain change period is longer than time T2 due to the effect of temperature characteristics or the like. Accordingly, timer 23 starts counting time T3 at the end of the count of time T2 by timer 211 (i.e., time point t5). Time T3 is an adjustment time added to prevent time T2 from being smaller than the actual gain change period when the gain change period becomes longer due to the temperature characteristics or the like of second variable gain amplifier 204.

At time point t6, a time period (T2+T3) exceeding the gain change period has elapsed since the start of the gain change of second variable gain amplifier 204, and thus the output of second variable gain amplifier 204 is completely free from the effect of the gain change and is stable. Control circuit 20 completes the two gain variation operations of first variable gain amplifier 104 and second AD converter 205. As a result, analog-to-digital conversion circuit 1 shifts to the normal operation mode in which first variable gain amplifier 104 and second variable gain amplifier 204 operate at the same gain.

In addition, at time point t7, the amplitude of the input signal decreases, and gain signals EG1 and EG2 are both assumed to be changed accordingly from indicating the onefold gain to indicating the twofold gain. In response to this, control circuit 20 changes gain control signal G1 from indicating the onefold gain to indicating the twofold gain, maintains the onefold gain indicated by gain control signal G2 without any change, and causes timer 111 to start counting time T1. In response to the change in gain control signal G1, first variable gain amplifier 104 changes the gain from onefold to twofold.

The period from time points t7 to t8 corresponds to the gain change period of first variable gain amplifier 104.

At time point t8, first variable gain amplifier 104 is in a state in which a stable digital value can be output at the twofold gain after the change. In addition, timer 23 starts counting time T3 that is an adjustment time, at the end of the count of time T1 by timer 111 (i.e., time point t8).

At time point t9, a time period (T1+T3) exceeding the gain change period has elapsed since the start of the gain change of first variable gain amplifier 104, and thus the output of first variable gain amplifier 104 is completely free from the effect of the gain change and is stable. In addition, in response to the completion of the gain change of first variable gain amplifier 104, control circuit 20 subsequently changes gain control signal G2 from indicating a onefold gain to indicating a twofold gain, and causes timer 211 to start counting time T2. In response to the change in gain control signal G2, second variable gain amplifier 204 changes the gain from onefold to twofold.

At time point t10, second variable gain amplifier 204 is in a state in which a stable digital value can be output at the twofold gain after the change. In addition, timer 23 starts counting time T3 at the end of the count of time T2 by timer 211 (i.e., time point t10).

At time point t11, a time period (T2+T3) exceeding the gain change period has elapsed since the start of the gain change of second variable gain amplifier 204, and thus the output of second variable gain amplifier 204 is completely free from the effect of the gain change and is stable. Control circuit 20 completes the two gain variation operations of first variable gain amplifier 104 and second AD converter 205. As a result, analog-to-digital conversion circuit 1 shifts to the normal operation mode in which first variable gain amplifier 104 and second variable gain amplifier 204 operate at the same gain.

Analog-to-digital conversion circuit 1 has: the normal operation mode in which first variable gain amplifier 104 and second variable gain amplifier 204 operate at the same gain; and the gain change mode in which the gain of first variable gain amplifier 104 or the gain of second variable gain amplifier 204 is changed.

In the operation example illustrated in FIG. 2A, in order to change the gain in the normal operation mode; that is, in order to change both the gain of first variable gain amplifier 104 and the gain of second variable gain amplifier 204, control circuit 20 first starts the gain change of first variable gain amplifier 104, and prohibits gain change of second variable gain amplifier 204 in the gain change period of first variable gain amplifier 104. Next, control circuit 20 starts the gain change of second variable gain amplifier 204 after the completion of the gain change period of first variable gain amplifier 104, and prohibits the gain change of first variable gain amplifier 104 in the gain change period of second variable gain amplifier 204. In this manner, control circuit 20 controls the gain change period in a relative manner such that the gain change period of first variable gain amplifier 104 does not overlap with the gain change period of second variable gain amplifier 204. In this manner, even in the gain change period of one of first variable gain amplifier 104 or second variable gain amplifier 204, it is possible to obtain a correct output from the AD converter corresponding to the other, and thus the waiting time due to a gain change can be reduced or eliminated. Moreover, analog-to-digital conversion circuit 1, as a current measurement circuit, makes it possible to achieve a high degree of functional safety performance with redundancy in the measurement of the current of cell stack 17 which varies significantly.

Next, another example of the operation of analog-to-digital conversion circuit 1 will be described.

Figure 2B:
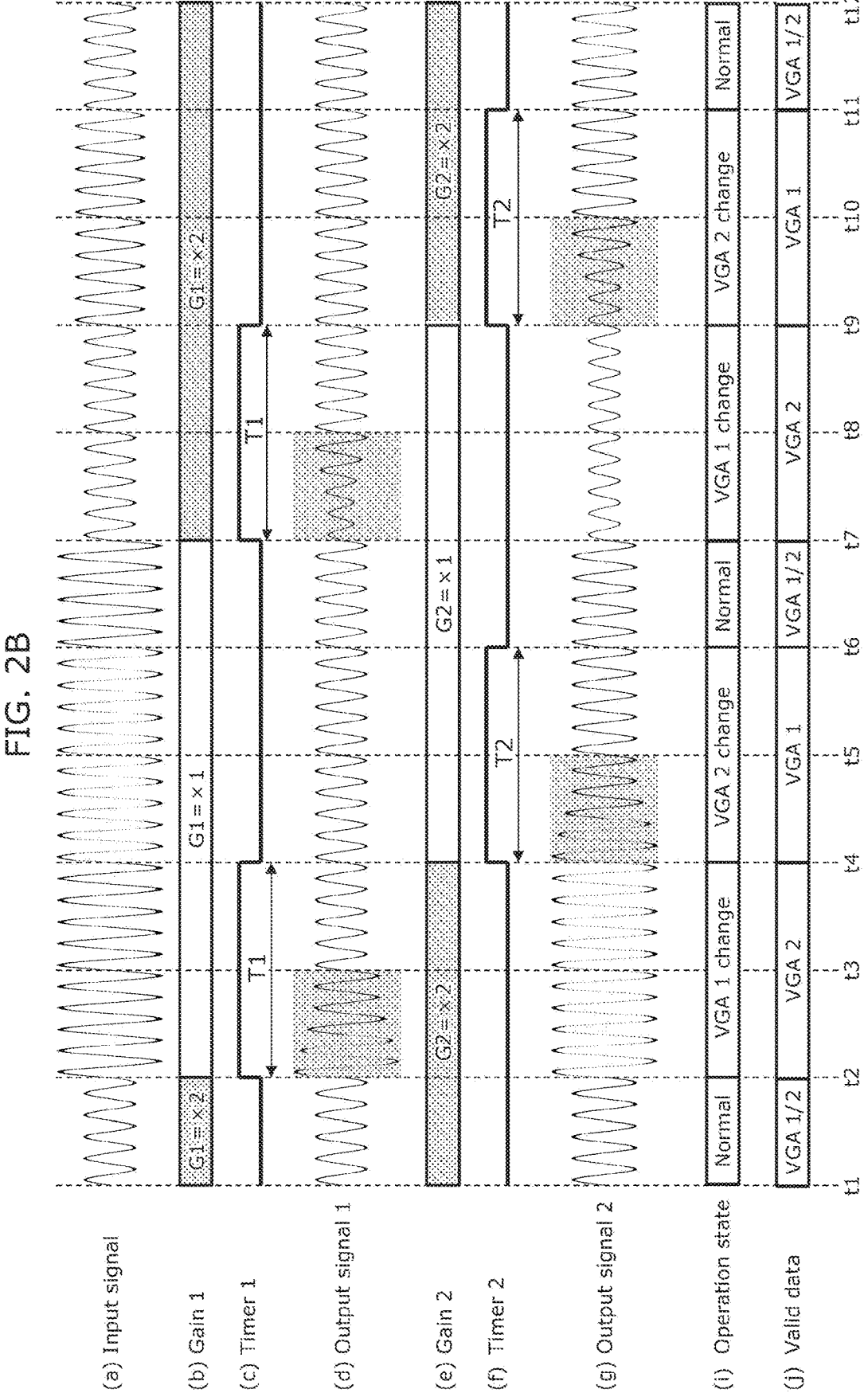
FIG. 2B is a time chart illustrating another example of the operation of the analog-to-digital conversion circuit according to Embodiment 1.

FIG. 2B is a time chart illustrating another example of the operation of analog-to-digital conversion circuit 1 according to Embodiment 1. FIG. 2B differs from FIG. 2A in that time T1 measured by timer 111 is changed to time T1+T3 of FIG. 2A, time T2 measured by timer 211 is changed to time T2+T3 of FIG. 2A, and timer 23 is not used. In the following description, redundant explanation of the same points will be omitted, to focus on the different points.

Time T1 in FIG. 2B is the sum of the gain change period of first variable gain amplifier 104 and an adjustment time. The adjustment time may be the same as time T3 of FIG. 2A, and is a time to prevent time T1 from being smaller than the actual gain change period even when the gain change period becomes longer due to the temperature characteristics or the like of second variable gain amplifier 204.

Time T2 in FIG. 2B is the sum of the gain change period of second variable gain amplifier 204 and an adjustment time.

In the example of the operation illustrated in FIG. 2B as well, in order to change the gain in the normal operation mode; that is, in order to change both the gain of first variable gain amplifier 104 and the gain of second variable gain amplifier 204 from the first gain to the second gain, control circuit 20 first starts the gain change of first variable gain amplifier 104, and prohibits the gain change of second variable gain amplifier 204 in the gain change period of first variable gain amplifier 104. Next, control circuit 20 starts the gain change of second variable gain amplifier 204 after the completion of the gain change period of first variable gain amplifier 104, and prohibits the gain change of first variable gain amplifier 104 in the gain change period of second variable gain amplifier 204. In this manner, control circuit 20 controls the gain change period in a relative manner such that the gain change period of first variable gain amplifier 104 does not overlap with the gain change period of second variable gain amplifier 204. In this manner, even in the gain change period of one of first variable gain amplifier 104 or second variable gain amplifier 204, it is possible to obtain a correct output from the AD converter corresponding to the other, and thus the waiting time due to a gain change can be reduced or eliminated.

It should be noted that, in FIG. 1, instead of first divider 106 and second divider 206, one divider may be provided in a poststage of selection circuit 6. This divider adjusts the weight of bits of the digital signal resulting from the selection by selection circuit 6.

In addition, the two gain signals EG1 and EG2 may be signals that always indicate the same value. In addition, one gain signal may be input instead of the two gain signals EG1 and EG2.

FIG. 1 illustrates an example in which the number of bits of the digital signal output by each of first AD converter 105 and second AD converter 205 is 14 bits, and the number of bits of the digital signal output by each of first divider 106 and second divider 206 is 17 bits, but the number of bits is not limited to this example.

In analog-to-digital conversion circuit 1 according to Embodiment 1, gain signal EG1 and gain signal EG2 for setting the gain of first variable gain amplifier 104 and the gain of second variable gain amplifier 204 are input to control circuit 20 which controls the gain change period. The two digital signals output from first divider 106 and second divider 206 can take the same weighted digital values even when the gain of first variable gain amplifier 104 and the gain of second variable gain amplifier 204 are changed.

In view of the above, when gain signal EG1 and gain signal EG2 are changed, control circuit 20 gives priority to one of gain control signals G1 or G2 to output, and temporarily prohibits the change of the gain control signal of the other in the gain change period of the one of gain control signals G1 or G2. In the meantime, selection circuit 6 selects and outputs the output value of the one whose gain has not been changed.

In addition, when gain signals EG1 and EG2 are changed at the same time, control circuit 20 performs the time control in a relative manner such that the gain of one of gain control signals G1 or G2 is changed first, and the gain of the other is changed after the end of the gain change period. In the gain change period of the other, selection circuit 6 selects the output value which has been changed earlier.

In the normal state in which the gain change is not performed, the two systems function as redundant measurements, and it is possible to use the average of the two measurement results as the measurement value, or to compare the two measurement results and output an error signal to indicate a measurement error when the error resulting from the comparison exceeds the allowable error.

This enables analog-to-digital conversion without interruption of output values even in the gain change period.

Analog-to-digital conversion circuit 1 is connected to shunt resistor 15 for current detection, thereby enabling high dynamic range current measurement of lithium ion cell stacks of electric vehicles.

A shunt resistor for current detection is used in FIG. 1, but a current sensor using a magnetic circuit is also capable of performing high dynamic range current measurement in a similar manner.

As described above, analog-to-digital conversion circuit 1 according to Embodiment 1 includes: first variable gain amplifier 104 connected to input terminal 2; first AD converter 105 connected to first variable gain amplifier 104; second variable gain amplifier 204 connected to input terminal 2; second AD converter 205 connected to second variable gain amplifier 204; selection circuit 6 to which an output of first AD converter 105 and an output of second AD converter 205 are input; and control circuit 20 that controls a gain change period of first variable gain amplifier 104 and a gain change period of second variable gain amplifier 204 in a relative manner.

According to the above-described configuration, it is possible to reduce the waiting time from the start of gain change to the point of obtaining a correct measurement value.

Here, the gain change period may be a time period from a start of a gain change of first variable gain amplifier 104 until an output of first variable gain amplifier 104 stabilizes or a time period from a start of a gain change of second variable gain amplifier 204 until an output of second variable gain amplifier 204 stabilizes, and control circuit 20 may control the gain change period of first variable gain amplifier 104 and the gain change period of second variable gain amplifier 204 to avoid overlap between the gain change period of first variable gain amplifier 104 and the gain change period of second variable gain amplifier 204.

In this manner, even in the gain change period of one of the first variable gain amplifier or the second variable gain amplifier, it is possible to obtain a correct output from the AD converter corresponding to the other. As a result, it is possible to eliminate the waiting time.

Here, analog-to-digital conversion circuit 1 may have: a normal operation mode in which first variable gain amplifier 104 and second variable gain amplifier 204 operate at same gain; and a gain change mode in which gain of first variable gain amplifier 104 and gain of second variable gain amplifier 204 are changed, and control circuit 20, in the gain change mode, may perform control to change gain of one of first variable gain amplifier 104 or second variable gain amplifier 204 from first gain to second gain, and then change gain of an other of first variable gain amplifier 104 or second variable gain amplifier 204 from the first gain to the second gain.

According to the above-described configuration, it is possible to reduce the waiting time from the start of gain change to the point of obtaining a correct measurement value.

Here, selection circuit 6 may select, in a gain change period of one of first variable gain amplifier 104 or second variable gain amplifier 204, an output of one of first AD converter 105 or second AD converter 205 which corresponds to an other of first variable gain amplifier 104 or second variable gain amplifier 204 whose gain has not been changed.

In this manner, even in the gain change period of one of the first variable gain amplifier or the second variable gain amplifier, it is possible to obtain a correct output from the selection circuit. As a result, it is possible to eliminate the waiting time.

Here, analog-to-digital conversion circuit 1 may further include: first divider 106 that divides the output of first AD converter 105 by a value indicating gain of first variable gain amplifier 104 to obtain a quotient, and outputs the quotient to selection circuit 6; and second divider 206 that divides the output of second AD converter 205 by a value indicating gain of second variable gain amplifier 204 to obtain a quotient, and outputs the quotient to selection circuit 6.

According to the above-described configuration, even when the gain of the first variable gain amplifier or the second variable gain amplifier is changed, it is possible to maintain the weight of the digital value without any change.

Here, a value indicating the gain of first variable gain amplifier 104 and a value indicating the gain of second variable gain amplifier 204 may each be expressed as a power of 2, and first divider 106 and second divider 206 may each perform division by bit shift.

According to the above-described configuration, even when the gain of the first variable gain amplifier or the second variable gain amplifier is changed, it is possible to maintain the weight of the digital value without any change.

Here, analog-to-digital conversion circuit 1 may further include: error detection circuit 10 that determines whether an error is present based on (i) the output of first AD converter 105 and the output of second AD converter 205 or (ii) an output of first divider 106 and an output of second divider 206, in a period in which first variable gain amplifier 104 and the second variable gain amplifier 204 operate at same gain.

According to the above-described configuration, even when the gain of first variable gain amplifier 104 or second variable gain amplifier 105 is changed, it is possible to implement the division operation to maintain the weight of the digital value by a simple bit shift.

In addition, the current measurement circuit according to Embodiment 1 includes the above-described analog-to-digital conversion circuit.

According to the above-described configuration, it is possible to reduce the waiting time from the start of gain change to the point of obtaining a correct measurement value.

Here, the current measurement circuit may further include a shunt resistor for current detection.

According to the above-described configuration, it is possible to implement the function of current detection with a simple circuit configuration.

Here, the current measurement circuit may further include a magnetic circuit for current detection.

According to the above-described configuration, it is possible to implement the function of current detection in a non-contact and low-loss manner.

Here, in the current measurement circuit, a current of a cell stack including one or more battery cells or one or more power storage capacitor cells may be measured.

In this manner, for cell stacks for electric vehicles, for example, it is possible to implement the functional safety and enable high dynamic range current measurement.

Embodiment 2

In addition to the configuration of analog-to-digital conversion circuit 1 described in Embodiment 1, Embodiment 2 describes an example of the configuration which includes an auto gain control (AGC) circuit that automatically changes the gain of first variable gain amplifier 104 and the gain of second variable gain amplifier 204 according to the magnitude of the amplitude of an analog signal that has been input.

Figure 3:
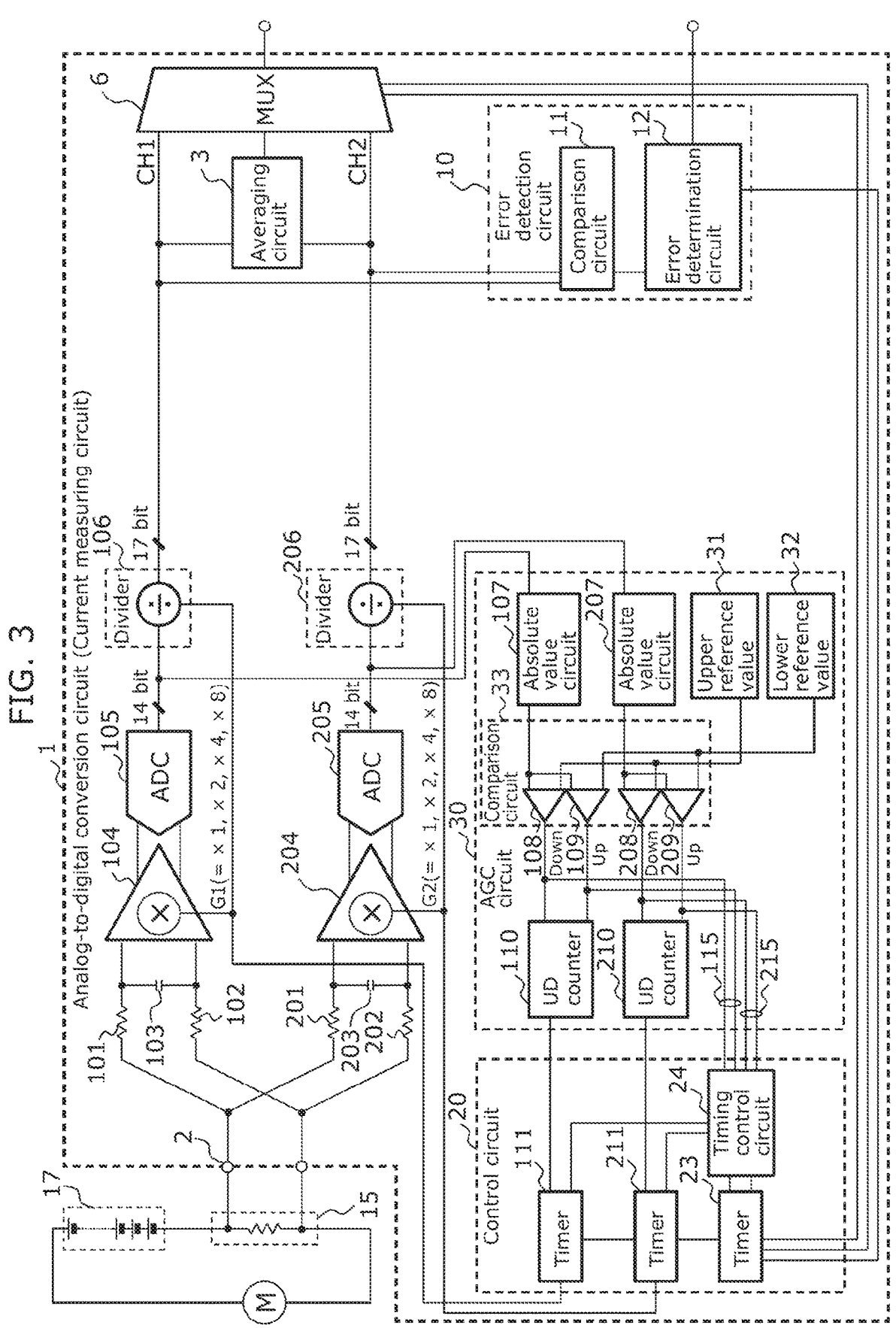
FIG. 3 is a diagram illustrating an example of the configuration of an analog-to-digital conversion circuit according to Embodiment 2.
Figure 4:
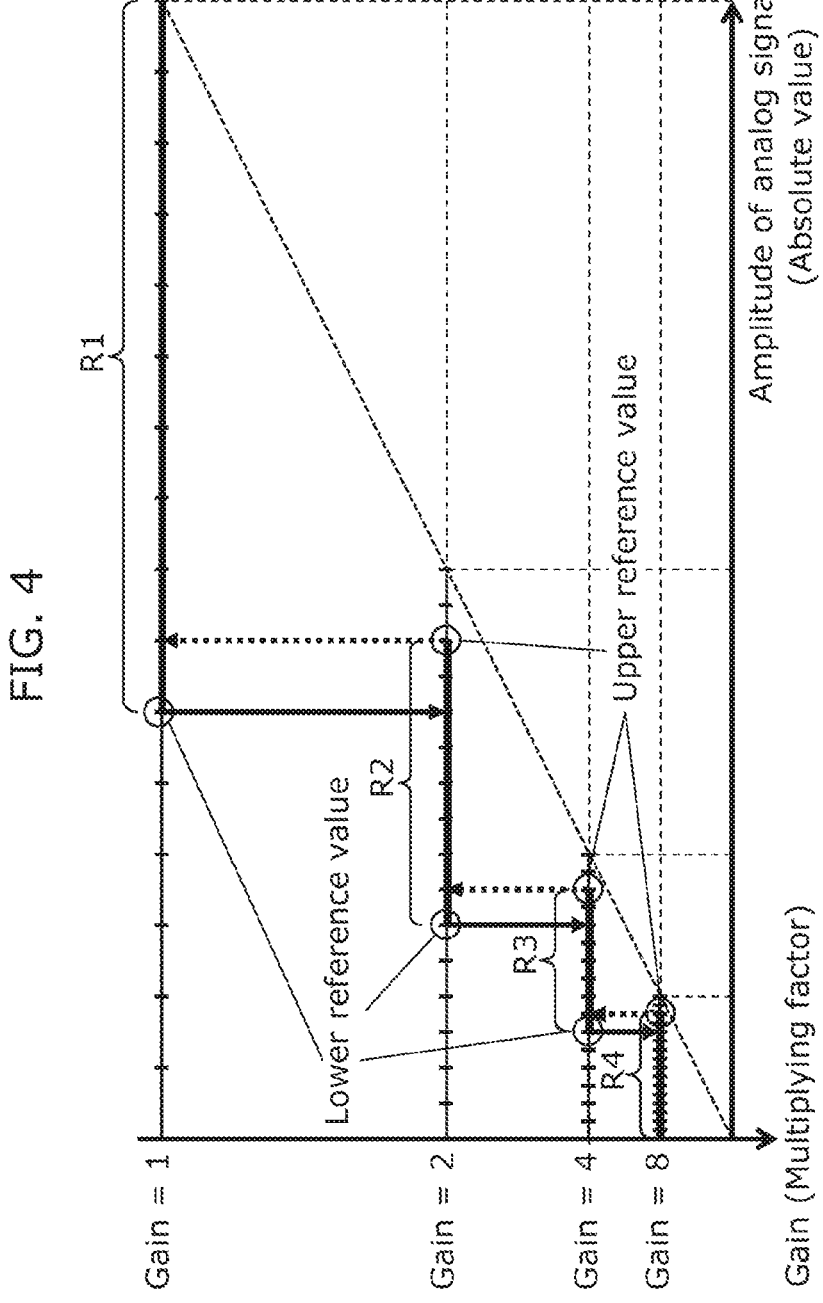
FIG. 4 is an explanatory diagram illustrating an example of an AGC operation of the analog-to-digital conversion circuit according to Embodiment 2.

FIG. 3 is a diagram illustrating an example of the configuration of an analog-to-digital conversion circuit according to Embodiment 2. In addition, FIG. 4 is an explanatory diagram illustrating an example of an AGC operation of the analog-to-digital conversion circuit according to Embodiment 2. The horizontal axis of FIG. 4 indicates the absolute value of the amplitude of the analog signal at input terminal 2. The vertical axis of FIG. 4 indicates the gain. Analog-to-digital conversion circuit 1 illustrated in FIG. 3 differs from analog-to-digital conversion circuit 1 illustrated in FIG. 1 in that there is no input of gain signals EG1 and EG2, and AGC circuit 30 is added. In the following description, redundant explanation of the same points will be omitted, to focus on the different points.

AGC circuit 30 is a circuit that generates gain signals EG1 and EG2, i.e., an auto gain control circuit that controls the gain of first variable gain amplifier 104 and the gain of second variable gain amplifier 204 to the optimal magnitude according to the magnitude of the amplitude of the analog signal input to input terminal 2. FIG. 3 illustrates first instruction signal 115 that corresponds to gain signal EG1, and second instruction signal 215 that corresponds to gain signal EG2. Control circuit 20 generates first instruction signal 115 which instructs an increase or decrease in gain according to the magnitude of the amplitude of an analog signal (the magnitude of the output of first AD converter 105 in FIG. 3), and second instruction signal 215 which instructs an increase or decrease in gain according to the magnitude of the output of second AD converter 205.

More specifically, AGC circuit 30 generates first instruction signal 115 and second instruction signal 215 such that the smaller the amplitude of the analog signal, the greater the gain of first variable gain amplifier 104 and the gain of second variable gain amplifier 204. For that reason, AGC circuit 30 includes absolute value circuit 107, absolute value circuit 207, upper reference value outputter 31, lower reference value outputter 32, comparison circuit 33, UD counter 110, and UD counter 210.

Absolute value circuit 107 is a circuit that outputs the absolute value of a digital signal output from first AD converter 105. Here, when the digital signal output from first AD converter 105 takes a negative value, the digital signal is assumed to be expressed in two's complement.

Absolute value circuit 207 is a circuit that outputs the absolute value of a digital signal output from second AD converter 205. Here, when the digital signal output from second AD converter 205 takes a negative value, the digital signal is assumed to be expressed in two's complement.

Upper reference value outputter 31 is a circuit that outputs an upper reference value to reduce the gain when the amplitude of the analog signal input to input terminal 2 increases. Upper reference value outputter 31 may be configured, for example, by any one of a nonvolatile memory, a register, or a fixed constant generation circuit. Examples of the upper reference value are indicated in FIG. 4.

Lower reference value outputter 32 is a circuit that outputs a lower reference value to reduce the gain when the amplitude of the analog signal input to input terminal 2 is reduced. Lower reference value outputter 32 may be configured, for example, by any one of a nonvolatile memory, a register, or fixed constant generation circuit. Examples of the lower reference value are indicated in FIG. 4.

Comparison circuit 33 is a circuit that compares the absolute value output from absolute value circuit 107 and the absolute value output from absolute value circuit 207 with the upper reference value and the lower reference value. Accordingly, comparison circuit 33 includes comparator 108, comparator 109, comparator 208, and comparator 209.

Comparator 108 compares the output of absolute value circuit 107, i.e., the absolute value of the digital signal of first AD converter 105, with the upper reference value. The result of this comparison indicates whether the absolute value of the amplitude of the analog signal exceeds the upper reference value, as indicated in FIG. 4.

Comparator 109 compares the output of absolute value circuit 107, i.e., the absolute value of the digital signal of first AD converter 105, with the lower reference value. The result of this comparison indicates whether the absolute value of the amplitude of the analog signal falls below the lower reference value, as indicated in FIG. 4.

The output signals of comparator 108 and comparator 109 are transmitted to UD counter 110 and timing control circuit 24, as first instruction signal 115.

Comparator 208 compares the output of absolute value circuit 207, i.e., the absolute value of the digital signal of second AD converter 205, with the upper reference value. The result of this comparison indicates whether the absolute value of the amplitude of the analog signal exceeds the upper reference value, as indicated in FIG. 4.

Comparator 209 compares the output of absolute value circuit 207, i.e., the absolute value of the digital signal of second AD converter 205, with the lower reference value. The result of this comparison indicates whether the absolute value of the amplitude of the analog signal falls below the lower reference value, as indicated in FIG. 4.

The output signals of comparator 208 and comparator 209 are transmitted to UD counter 210 and timing control circuit 24, as second instruction signal 215.

UD counter 110 is an up/down counter that holds a value corresponding to the gain that is to be set to first variable gain amplifier 104, and counts down or counts up this value. UD counter 110 outputs the value that is held, to control circuit 20 as a gain for gain control signal G1. More specifically, UD counter 110 counts down (i.e., reduces the gain indicated by gain control signal G1 by one step) when comparator 108 indicates that the absolute value of the amplitude of the analog signal exceeds the upper reference value. In addition, UD counter 110 counts up (i.e., increases the gain indicated by gain control signal G1 by one step) when comparator 109 indicates that the absolute value of the amplitude of the analog signal falls below the lower reference value.

UD counter 210 is an up/down counter that holds a value corresponding to the gain that is to be set to second variable gain amplifier 204, and counts down or counts up this value. UD counter 210 outputs the value that is held, to control circuit 20 as a gain for gain control signal G2. More specifically, UD counter 210 counts down (i.e., reduces the gain indicated by gain control signal G2 by one step) when comparator 208 indicates that the absolute value of the amplitude of the analog signal exceeds the upper reference value. In addition, UD counter 210 counts up (i.e., increases the gain indicated by gain control signal G2 by one step) when comparator 209 indicates that the absolute value of the amplitude of the analog signal falls below the lower reference value.

In FIG. 4, the transitions of gain indicated by the dotted lines correspond to the countdown of UD counter 110 and UD counter 210 which reduce the gain by one step. In addition, the transitions of gain indicated by the solid lines correspond to the countup of UD counter 110 and UD counter 210 which increase the gain by one step.

In addition, amplitude range R4 illustrated in FIG. 4 indicates an amplitude range of approximately ⅛ or less of the input range of first variable gain amplifier 104 and second variable gain amplifier 204. Amplitude range R3 indicates an amplitude range of from approximately ⅛ to approximately ¼ of the input range. Amplitude range R2 indicates an amplitude range of from approximately ¼ to approximately ½ of the input range. Amplitude range R1 indicates an amplitude range of approximately ½ or greater of the input range. In the example illustrated in FIG. 4, AGC circuit 30 multiplies the gain indicated by gain control signals G1 and G2 by 8 when the absolute value of the amplitude of the analog signal is approximately within amplitude range R4. AGC circuit 30 multiplies the gain indicated by gain control signals G1 and G2 by 4 when the absolute value of the amplitude of the analog signal is approximately within amplitude range R3. AGC circuit 30 multiplies the gain indicated by gain control signals G1 and G2 by 2 when the absolute value of the amplitude of the analog signal is approximately within amplitude range R2. AGC circuit 30 multiplies the gain indicated by gain control signals G1 and G2 by 1 when the absolute value of the amplitude of the analog signal is approximately within amplitude range R1.

As described above, with AGC circuit 30, it is possible to expand the dynamic range of analog-to-digital conversion circuit 1 and improve the conversion accuracy (resolution) when the amplitude of the analog signal is relatively small. The bold lines that are parallel to the horizontal axis of FIG. 4 and correspond to amplitude ranges R1 to R4 indicate the correspondence relationship between gain and resolution in analog-to-digital conversion circuit 1 according to Embodiment 2. In FIG. 4, the smaller the amplitude of the analog signal, the higher the resolution.

It should be noted that the upper reference values and the lower reference values indicated in FIG. 4 are examples, and thus the upper reference values and the lower reference values are not limited to these examples.

As described above, AGC circuit 30 is added in Embodiment 2. With AGC, a waiting time for AGC response is required when the gain is automatically changed. However, control circuit 20 is capable of reducing or eliminating the interruption of output values and the generation of the waiting time, by performing the gain change of the two systems exclusively and, when the gain of one is changed, prohibiting change of the gain of the other during the waiting time for AGC response.

As described above, analog-to-digital conversion circuit 1 according to Embodiment 2 includes: automatic gain control (AGC) circuit 30 that generates first instruction signal 115 and second instruction signal 215, first instruction signal 115 instructing an increase or decrease of gain according to a magnitude of the output of first AD converter 105, second instruction signal 215 instructing an increase or decrease of gain according to a magnitude of the output of second AD converter 205. In analog-to-digital conversion circuit 1, control circuit 20 controls a gain change of first variable gain amplifier 104 and a gain change of second variable gain amplifier 204, according to first instruction signal 115 and second instruction signal 215.

According to the above-described configuration, although a waiting time for the AGC circuit response is generated, it is possible to reduce or eliminate the waiting time, by controlling the gain change period of the first variable gain amplifier and the gain change period of the second variable gain amplifier in a relative manner; that is, for example, by prohibiting, when the gain of one is changed, change of the gain of the other.

Here, control circuit 20 may include first timer 111 that counts the gain change period of first variable gain amplifier 104, and does not start the gain change of second variable gain amplifier 204 during counting by first timer 111.

In this manner, when the gain of the first variable gain amplifier is changed, it is possible to reduce or eliminate the waiting time by prohibiting the change of the gain of the second variable gain amplifier.

Here, control circuit 20 may include second timer 211 that counts the gain change period of second variable gain amplifier 204, and does not start the gain change of first variable gain amplifier 104 during counting by second timer 211.

In this manner, when the gain of the second variable gain amplifier is changed, it is possible to reduce or eliminate the waiting time by prohibiting the change of the gain of the first variable gain amplifier.

Embodiment 3

In addition to the configuration of the analog-to-digital conversion circuit according to Embodiment 2, Embodiment 3 describes an example of the configuration which includes a circuit that compares the values of two systems and corrects a gain error and an offset error in a period in which the gain settings of the two systems differ.

First variable gain amplifier 104 and second variable gain amplifier 204, when configured in an integrated circuit, have a gain error and an offset error, and when the gain is varied, the gain error and the offset error also change. Such a gain error and an offset error are often larger than the quantization errors of first AD converter 105 and second AD converter 205, and even with the same input value, there may be a shift, before and after the change of the gain, in the digital value after AD conversion. In view of the above, it is conceivable to measure a gain error and an offset error each time the gain of first variable gain amplifier 104 and the gain of first AD converter 105 are changed, store them in a nonvolatile memory, and correct the digital values. However, this method requires a process called trimming in which a gain error and an offset error are measured and stored in a nonvolatile memory at the time of pre-shipment inspection of an integrated circuit. In addition, a gain error and an offset error are often temperature-dependent and change over time, and trimming is sometimes not sufficient for correcting the errors.

Embodiment 3 describes an example of the configuration that enables a gain error and an offset error to be corrected during operation (background correction) as well as eliminating the waiting time from the start of gain change to the point of obtaining a correct measurement value.

Figure 5:
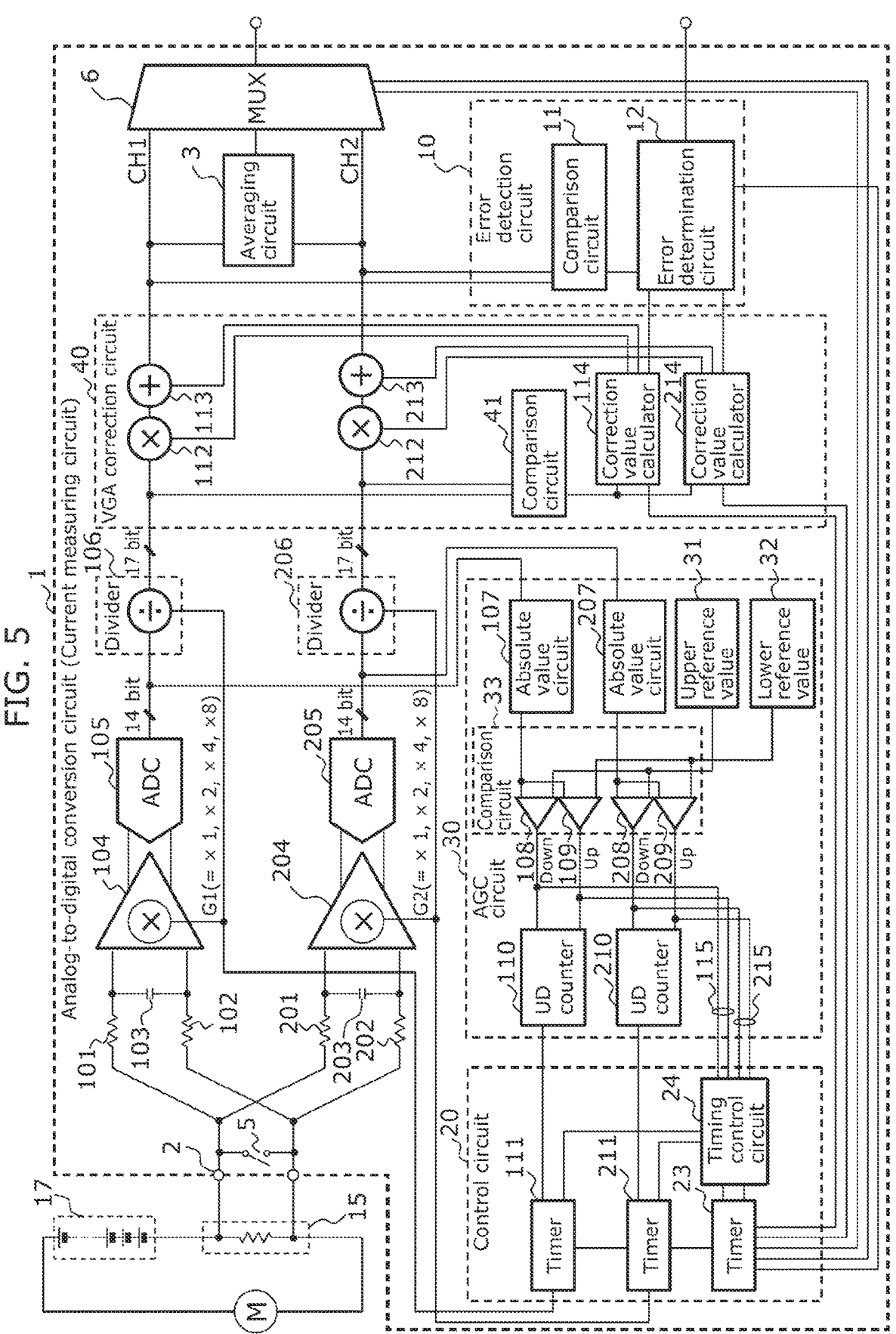
FIG. 5 is a diagram illustrating an example of the configuration of an analog-to-digital conversion circuit according to Embodiment 3.

FIG. 5 is a diagram illustrating an example of the configuration of an analog-to-digital conversion circuit according to Embodiment 3. Analog-to-digital conversion circuit 1 illustrated in FIG. 5 differs from analog-to-digital conversion circuit 1 illustrated in FIG. 3 in that switch 5 and VGA correction circuit 40 are added. In the following description, redundant explanation of the same points will be omitted, to focus on the different points.

Switch 5 is a switch that shorts the pair of terminals of input terminals 2. The purpose of the short is to measure the offset error in the output values of first variable gain amplifier 104 and second variable gain amplifier 204 by setting the input value of the analog signal to zero.

VGA correction circuit 40 is a circuit that corrects a gain error and an offset error of first variable gain amplifier 104 and first AD converter 105. Accordingly, VGA correction circuit 40 includes multiplier 112, adder 113, multiplier 212, adder 213, comparison circuit 41, correction value calculator 114, and correction value calculator 214.

Multiplier 112 multiplies an output value of first divider 106 by a correction coefficient from correction value calculator 114. Multiplier 112 corrects the gain error of first variable gain amplifier 104 by this multiplication.

Adder 113 adds the output value of multiplier 112 and a correction constant value from correction value calculator 114. Adder 113 corrects the offset error of first variable gain amplifier 104 by this addition. It should be noted that adder 113 may be disposed at a pre-stage of multiplier 112.

Multiplier 212 multiplies an output value of second divider 206 by a correction coefficient from correction value calculator 214. Multiplier 212 corrects the gain error of second variable gain amplifier 204 by this multiplication.

Adder 213 adds the output value of multiplier 212 and a correction constant value from correction value calculator 214. Adder 213 corrects the offset error of second variable gain amplifier 204 by this addition. It should be noted that adder 213 may be disposed at a pre-stage of multiplier 212.

Comparison circuit 41 compares the output value of first divider 106 with the output value of second divider 206 in the period in which the gain of first variable gain amplifier 104 and the gain of second variable gain amplifier 204 are different. The results of this comparison are supposed to match ideally, but in reality, a gain error and an offset error are caused by a difference in gain, changes over time, variations due to temperature characteristics, etc.

When the gain of one of first variable gain amplifier 104 and second variable gain amplifier 204 which have been operating in the normal operation mode is changed and the gain change period has elapsed, correction value calculator 114 and correction value calculator 214 calculate a correction coefficient for a gain error and a correction constant value for an offset error for the above-described one of first variable gain amplifier 104 and second variable gain amplifier 204 after the gain change, using, as reference, the output of the other whose gain has not been changed. The offset error may be measured by turning switch 5 on temporarily or by storing an offset value measured in advance.

In addition, error detection circuit 10 is connected to VGA correction circuit 40, and determines as an error when the output of error detection circuit 10 exceeds an allowable range during correction or when two output values exceed an allowable range in the normal operation mode.

Next, an example of the operation of analog-to-digital conversion circuit 1 according to the present embodiment will be described.

Figure 6:
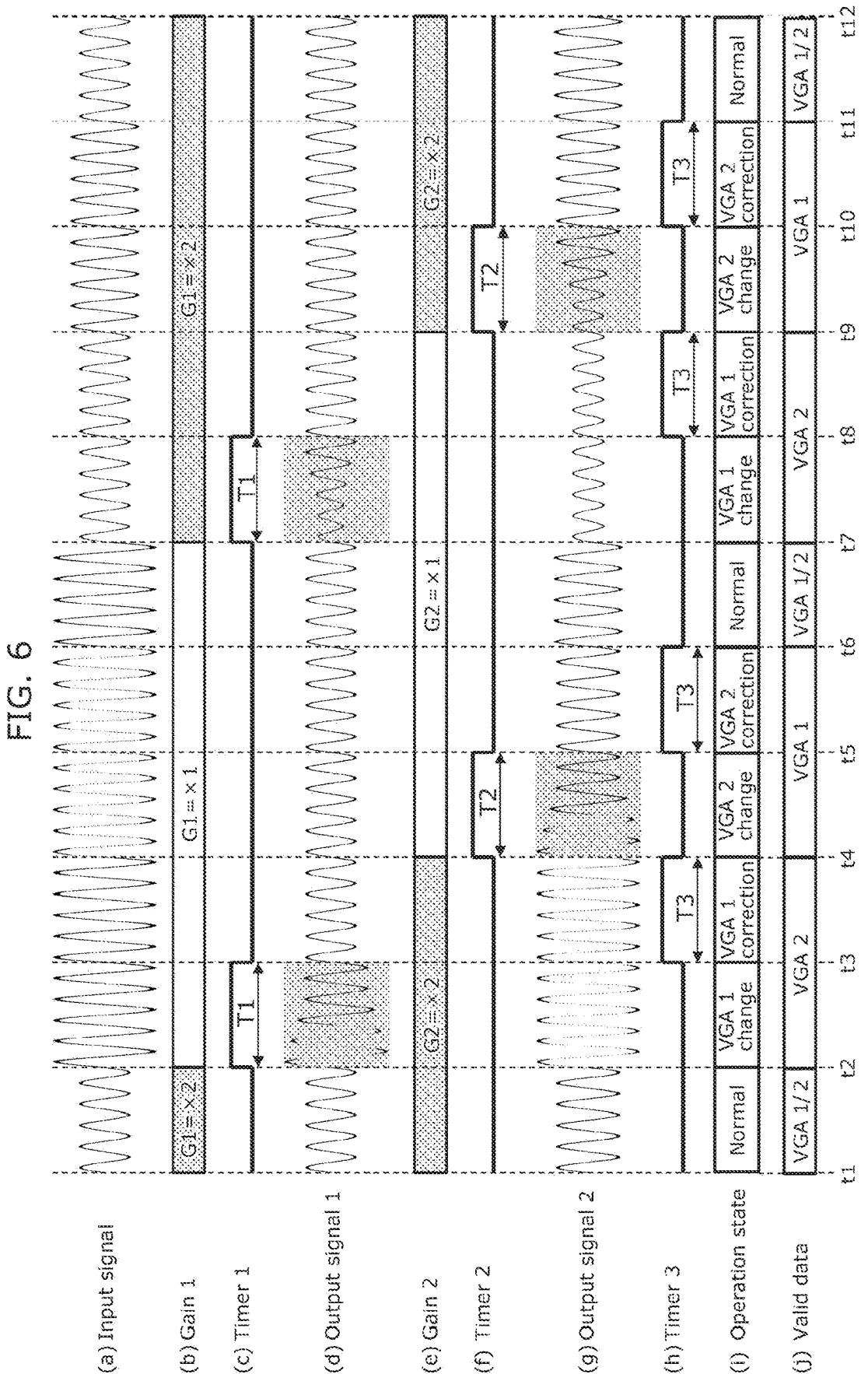
FIG. 6 is a time chart illustrating an example of the operation of the analog-to-digital conversion circuit according to Embodiment 3.
Figure 7:
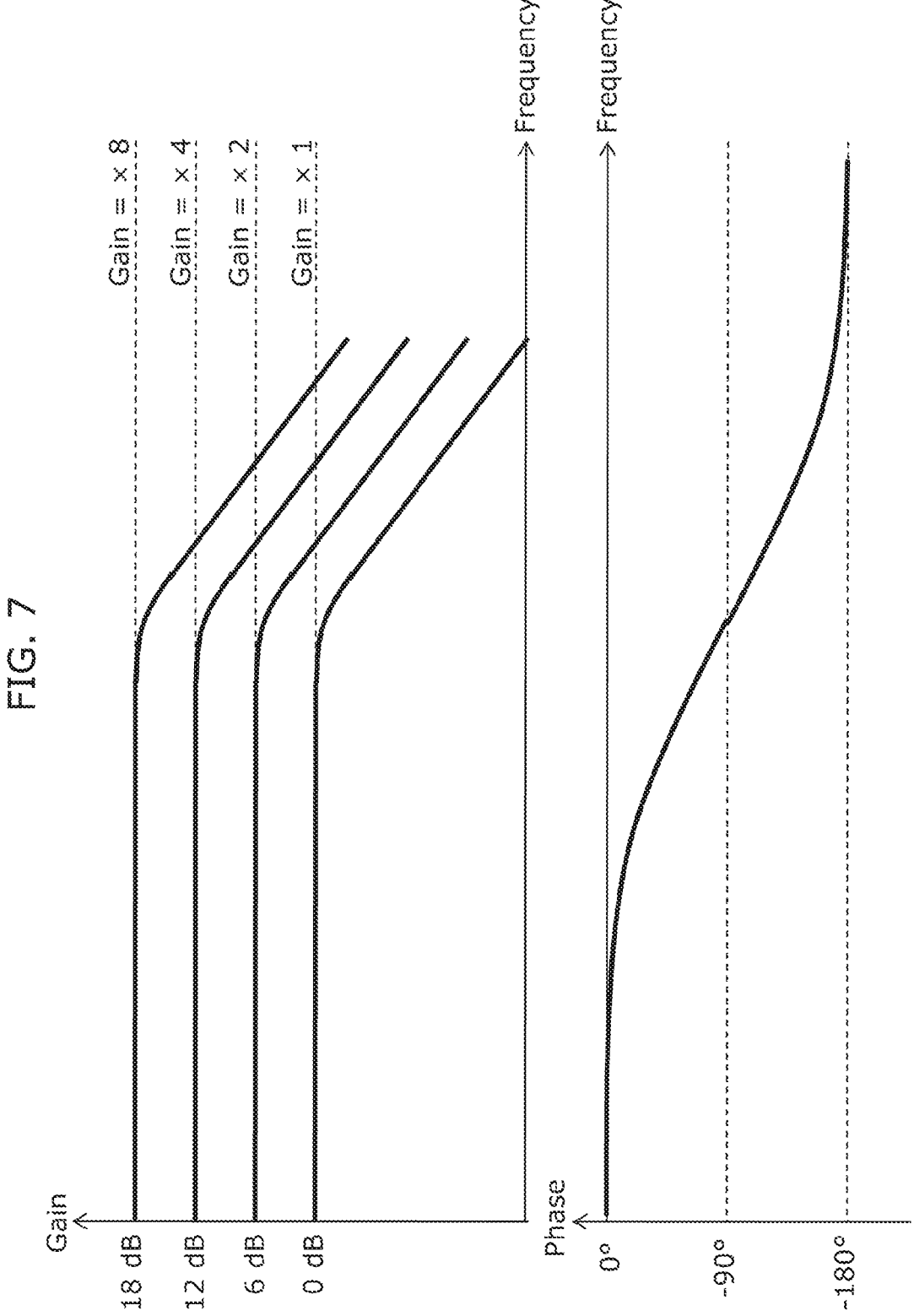
FIG. 7 is a diagram illustrating the characteristics of a general variable gain amplifier.

FIG. 6 is a time chart illustrating an example of the operation of an analog-to-digital conversion circuit according to Embodiment 3. This diagram differs from FIG. 2A in that an example of correction operation performed by VGA correction circuit 40 is added to the field denoted by (i) Operating state. The following description focuses on the differences.

Time T3 indicated in FIG. 6 includes the time for the correction value calculation and correction operation as well as the adjustment of time T1.

From time point t3 to time point t4, VGA correction circuit 40 calculates a correction coefficient and a correction constant value for correcting the gain error and offset error of first variable gain amplifier 104, using as a reference second variable gain amplifier 204 whose gain has not been changed, and corrects the output value of first divider 106 corresponding to the gain that has been changed, using multiplier 112 and adder 113.

From time point t5 to time point t6, VGA correction circuit 40 calculates a correction coefficient and a correction constant value for correcting the gain error and offset error of second variable gain amplifier 204, using as a reference first variable gain amplifier 104 whose gain has not been changed, and corrects the output value of second divider 206 corresponding to the gain that has been changed, using multiplier 212 and adder 213.

From time point t8 to time point t9, VGA correction circuit 40 operates in the same manner as performed from time point t3 to time point t4.

From time point t10 to time point t11, VGA correction circuit 40 operates in the same manner as performed from time point t5 to time point t6.

As described above, VGA correction circuit 40 corrects the gain error and offset error of the output value after the gain is changed, using as a reference the output value whose gain has not been changed in the period in which the gain of first variable gain amplifier 104 and the gain of second variable gain amplifier 204 are different such that the corrected output value becomes close to the same value. Then, when the gain of the other is changed, the same correction is performed, thereby facilitating performing background correction to perform correction during operation. Furthermore, the correction of the analog-to-digital conversion is alternately performed for the two systems, and thus the measurement error between the two systems is further reduced. It is thus optimal for the current measurement circuit with redundancy.

As described above, in Embodiment 3, VGA correction circuit 40 compares the values of the two systems at the time when the gain settings of the two systems differ, and corrects the gain error and the offset error.

When the gain of one of first variable gain amplifier 104 or second variable gain amplifier 204 is changed, VGA correction circuit 40 corrects, after the gain change period, the gain error and the offset error of the one of first variable gain amplifier 104 or second variable gain amplifier 204 whose gain has been changed, using as a reference the output of the other of first variable gain amplifier 104 or second variable gain amplifier 204 whose gain has not been changed such that the corrected output value becomes close to the same value. Then, when the gain of the other is changed, the same correction is performed, thereby facilitating performing background correction to perform the correction during operation. Furthermore, with VGA correction circuit 40, the correction of the analog-to-digital conversion is alternately performed for the two systems, and thus the measurement error between the two systems is further reduced. It is thus optimal for the current measurement circuit with redundancy.

As described above, analog-to-digital conversion circuit 1 according to Embodiment 3 includes: VGA correction circuit 40 that corrects a first output value obtained by first divider 106 or a second output value obtained by second divider 206, to minimize a difference between the first output value and the second output value.

According to the above-described configuration, since the difference between the first output value and the second output value is reduced, it is possible to correct the characteristic difference that can occur between the two systems with redundancy.

Here, VGA correction circuit 40 may include a multiplier circuit that multiplies the first output value or the second output value by a correction coefficient.

According to the above-described configuration, it is possible to correct the gain error between the first variable gain amplifier and the second variable gain amplifier Here, VGA correction circuit 40 may include an adder circuit that adds a correction constant value to the first output value or the second output value.

According to the above-described configuration, it is possible to correct the offset error between the first variable gain amplifier and the second variable gain amplifier Here, VGA correction circuit 40 may correct the first output value or the second output value in a period in which the gain of the first variable gain amplifier and the gain of the second variable gain amplifier differ.

According to this, VGA correction circuit 40 is suitable for a circuit including two systems with redundancy.

As described above, the present disclosure is optimal for analog-to-digital conversion circuits that require redundancy and high dynamic range.

In particular, in an electric vehicle powered by a lithium ion cell stack, the output current value of the lithium ion cell stack varies rapidly and irregularly from approximately a few mA to several 100A from a complete standstill state to a maximum output. The dynamic range of the current measurement requires at least 120 dB because the width of the change is 100,000 times larger or more. However, it is difficult to achieve such a dynamic range even with a delta-sigma ADC which can achieve a high dynamic range. On the other hand, the change in current has no regularity, and conventional AGCs cannot detect steep current changes due to the response time of the AGC feedback loop. The present disclosure is optimal for the current measurement of lithium ion cell stacks in electric vehicles which require a high dynamic range, no interruption in measurements, and achieving a high degree of functional safety performance with redundancy.

Although analog-to-digital conversion circuit 1 and the current measurement circuit according to one or more aspects of the present disclosure have been described above based on the embodiments, the present disclosure is not limited to the above-described embodiments. Other forms in which various modifications apparent to those skilled in the art are applied to the embodiment, or forms structured by combining structural components of different embodiments may be included within the scope of one or more aspects of the present disclosure, unless such changes and modifications depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is suitable for an analog-to-digital conversion circuit and a current measurement circuit.

The invention claimed is:

1. An analog-to-digital conversion circuit comprising:
a first variable gain amplifier connected to an input terminal;
a first AD converter connected to the first variable gain amplifier;
a second variable gain amplifier connected to the input terminal;
a second AD converter connected to the second variable gain amplifier;
a selection circuit to which an output of the first AD converter and an output of the second AD converter are input;
a control circuit that controls a gain change period of the first variable gain amplifier and a gain change period of the second variable gain amplifier in a relative manner; and
a divider.

2. The analog-to-digital conversion circuit according to claim 1, wherein
the gain change period is a time period from a start of a gain change of the first variable gain amplifier until an output of the first variable gain amplifier stabilizes or a time period from a start of a gain change of the second variable gain amplifier until an output of the second variable gain amplifier stabilizes, and
the control circuit controls the gain change period of the first variable gain amplifier and the gain change period of the second variable gain amplifier to avoid overlap between the gain change period of the first variable gain amplifier and the gain change period of the second variable gain amplifier.

3. The analog-to-digital conversion circuit according to claim 1, wherein
the analog-to-digital conversion circuit has: a normal operation mode in which the first variable gain amplifier and the second variable gain amplifier operate at same gain; and a gain change mode in which gain of the first variable gain amplifier and gain of the second variable gain amplifier are changed, and
the control circuit, in the gain change mode, performs control to change gain of one of the first variable gain amplifier or the second variable gain amplifier from first gain to second gain, and then change gain of an other of the first variable gain amplifier or the second variable gain amplifier from the first gain to the second gain.

4. The analog-to-digital conversion circuit according to claim 1, wherein
the selection circuit selects, in a gain change period of one of the first variable gain amplifier or the second variable gain amplifier, an output of one of the first AD converter or the second AD converter which corresponds to an other of the first variable gain amplifier or the second variable gain amplifier whose gain has not been changed.

5. An analog-to-digital conversion circuit comprising:
a first variable gain amplifier connected to an input terminal;
a first AD converter connected to the first variable gain amplifier;
a second variable gain amplifier connected to the input terminal;
a second AD converter connected to the second variable gain amplifier;
a selection circuit to which an output of the first AD converter and an output of the second AD converter are input;
a control circuit that controls a gain change period of the first variable gain amplifier and a gain change period of the second variable gain amplifier in a relative manner;
a first divider that divides the output of the first AD converter by a value indicating gain of the first variable gain amplifier to obtain a quotient, and outputs the quotient to the selection circuit; and
a second divider that divides the output of the second AD converter by a value indicating gain of the second variable gain amplifier to obtain a quotient, and outputs the quotient to the selection circuit.

6. The analog-to-digital conversion circuit according to claim 5, wherein
a value indicating the gain of the first variable gain amplifier and a value indicating the gain of the second variable gain amplifier are each expressed as a power of 2, and
the first divider and the second divider each perform division by bit shift.

7. The analog-to-digital conversion circuit according to claim 5, further comprising:
an error detection circuit that determines whether an error is present based on (i) the output of the first AD converter and the output of the second AD converter or (ii) an output of the first divider and an output of the second divider, in a period in which the first variable gain amplifier and the second variable gain amplifier operate at same gain.

8. The analog-to-digital conversion circuit according to claim 5, further comprising:
a correction circuit that corrects a first output value obtained by the first divider or a second output value obtained by the second divider, to minimize a difference between the first output value and the second output value.

9. The analog-to-digital conversion circuit according to claim 8, wherein the correction circuit includes a multiplier circuit that multiplies the first output value or the second output value by a correction coefficient.

10. The analog-to-digital conversion circuit according to claim 8, wherein the correction circuit includes an adder circuit that adds a correction constant value to the first output value or the second output value.

11. The analog-to-digital conversion circuit according to claim 8, wherein the correction circuit corrects the first output value or the second output value in a period in which the gain of the first variable gain amplifier and the gain of the second variable gain amplifier differ.

12. An analog-to-digital conversion circuit comprising:

a first variable gain amplifier connected to an input terminal;

a first AD converter connected to the first variable gain amplifier;

a second variable gain amplifier connected to the input terminal;

a second AD converter connected to the second variable gain amplifier;

a selection circuit to which an output of the first AD converter and an output of the second AD converter are input;

a control circuit that controls a gain change period of the first variable gain amplifier and a gain change period of the second variable gain amplifier in a relative manner; and an automatic gain control (AGC) circuit that generates a first instruction signal and a second instruction signal, the first instruction signal instructing an increase or decrease of gain according to a magnitude of the output of the first AD converter, the second instruction signal instructing an increase or decrease of gain according to a magnitude of the output of the second AD converter, wherein the control circuit controls a gain change of the first variable gain amplifier and a gain change of the second variable gain amplifier, according to the first instruction signal and the second instruction signal.

13. The analog-to-digital conversion circuit according to claim 12, wherein the control circuit includes a first timer that counts the gain change period of the first variable gain amplifier, and does not start the gain change of the second variable gain amplifier during counting by the first timer.

14. The analog-to-digital conversion circuit according to claim 12, wherein the control circuit includes a second timer that counts the gain change period of the second variable gain amplifier, and does not start the gain change of the first variable gain amplifier during counting by the second timer.

15. A current measurement circuit comprising:

the analog-to-digital conversion circuit according to claim 1.

16. The current measurement circuit according to claim 15, further comprising:

a shunt resistor for current detection.

17. The current measurement circuit according to claim 15, further comprising:

a magnetic circuit for current detection.

18. The current measurement circuit according to claim 15, wherein a current of a cell stack is measured, the cell stack including one or more battery cells or one or more power storage capacitor cells.

19. The analog-to-digital conversion circuit according to claim 1, wherein the divider is connected to the selection circuit in a poststage of the selection circuit.

* * * * *